ically,
United States Patent [19]
Dennison et al.

[11] 3,953,839
[45] Apr. 27, 1976

[54] BIT CIRCUITRY FOR ENHANCE-DEPLETE RAM

[75] Inventors: Richard T. Dennison, Hopewell Junction; David B. Eardley, Stanfordville, both of N.Y.

[73] Assignee: International Business Machines Corporation, Armonk, N.Y.

[22] Filed: Apr. 10, 1975

[21] Appl. No.: 566,896

[52] U.S. Cl. .................... 340/173 R; 340/173 FF; 307/238
[51] Int. Cl.[2] .................. G11C 13/00; G11C 11/40
[58] Field of Search .................. 340/173 R, 173 FF; 307/238, 279

[56] References Cited
UNITED STATES PATENTS
3,882,469   5/1975   Gosney ........................... 340/173 R

*Primary Examiner*—Terrell W. Fears
*Attorney, Agent, or Firm*—Wesley DeBruin

[57] ABSTRACT
The disclosure is an improved Random Access Memory (RAM) integrated circuit chip. More specifically, enhancement - depletion mode field effect transistor technology is employed to provide a solid state memory having improved "reading" and "writing" capability.

A pair of N-channel depletion mode devices are used to initialize the bit lines before the start of the next read or write cycle. These devices are switched to a high conductive state resulting in a rapid initialization of the bit lines. A sense latch circuit incorporating enhancement and depletion mode devices is used to detect and latch a small differential signal on the bit lines. The state of the sense latch is isolated from and does not affect the bit line voltages at any time during the memory cycle. M pairs of N-channel depletion mode devices are provided. One pair for each of B/S lines. M sense latch circuits are provided. One for each pair of B/S lines.

In addition, there is provided a final sense latch circuit which is employed as the final latch in the bit circuits. The final sense latch is set with the data from a selected one of said M sense latch circuits. The final sense latch circuit provides an output which drives a data output driver.

12 Claims, 7 Drawing Figures

BIT CIRCUITRY FOR ENHANCE-DEPLETE RAM

BACKGROUND OF THE INVENTION AND PRIOR ART

Field Effect Transistor technology is a relatively highly developed art, which is currently under extensive development and investigation by the art in general. There are a sizeable number of published articles, patents and text books directed to theory, structure, methods of fabrication, process technology, circuitry and application of field effect devices.

MOSFETs (Metal-Oxide Silicon field effect transistors), MISFETs (Metal Insulator Silicon Field Effect Transistors) and IGFETs (Insulated Gate Field Effect Transistors) are terms extensively employed in the art and possessing well established definitions in the art. "N-channel", "P-channel", "Enhancement Mode", "Depletion Mode" and "CMOS" (Complementary Metal Oxide Silicon) are additional terms extensively employed in the art and possessing well established definitions. At least certain of the foregoing terms will be used hereinafter. When used hereinafter, their use will be in full accord with the generally established definition given said phrase or word in the art.

Numerous texts fully explain the theory of operation of field effect transistors. Two such texts are: (1) "MOSFET in Circuit Design" by Robert H. Crawford (Texas Instrument Series) McGraw Hill, copyright 1967 by Texas Instruments Incorporated and (2) "ELECTRONICS: BJTs, FETs and Microcircuits" by E. James Angelo, Jr., McGraw Hill Electrical and Electronic Engineering Series, copyrighted 1969 by McGraw Hill.

A publication tracing the development of the field effect transistor, evidencing its high state of development, and explaining in non-mathematical terms its operation is the following article: "Metal-Oxide Semiconductor Technology" by William C. Hittinger, Scientific American, August 1973, pages 48 through 57.

U.S. Pat. No. 3,588,848 granted June 28, 1971 to H. W. Van Beek is directed to an Input-Output Control circuit for a complementary MOS integrated memory circuit. The control circuit provides low impedance to bit lines during the "write" cycle and high impedance during the "read" cycle so that the memory cell states won't be changed by control circuit signals.

U.S. Pat. No. 3,644,904 granted Feb. 22, 1972 to L. T. Baker is directed to a chip select circuit for multichip random access memory. The decoding of the chip select signal inhibits the write command signal from all but the selected chip, thereby permitting new data to be written only at the selected chip.

U.S. Pat. No. 3,685,027 granted Aug. 15, 1972 to C. A. Allen is directed to a dynamic MOS memory array chip which utilizes four-device cells. During the refresh cycle, all of the bit/sense line pairs are gated to a charging potential and all of the word lines are pulsed simultaneously so that all cells in the array can be refreshed together. The refresh pulse level applied to all of the word lines is lower than the select pulse level applied to any one of the word lines during a read or write operation.

U.S. Pat. No. 3,706,975 granted Dec. 19, 1972 to R. J. Paluck is directed to a high speed insulated gate field effect transistor random access memory circuit integrated on a monolithic chip. The MOS random access memory circuit utilizes a low voltage decoding circuit that is compatible with transistor-transistor-logic circuit output levels, enabling a reduction in the number of discrete MOS devices required for each memory cell. Also disclosed is a method for decoding wherein all of the lines of the memory matrix are brought high at the start of each cycle, recharging the internal capacitance of all of the memory cells of the matrix. All of the undesired lines of the memory matrix are then discharged through an OR circuit arrangement connected in series with each line, thereby disconnecting all but a preselected cell of the memory matrix from the computer input/output sense lines.

U.S. Pat. No. 3,742,465 granted June 26, 1973 to W. M. Regitz discloses an electronic memory element for use in a random access memory array. The memory element includes three MOS field effect transistors arranged to provide for the binary storage of data. Two additional MOS transistors stabilize the voltages on the bit lines and amplify the read signal. Also disclosed is a sense amplifier, operable during a read cycle, and a digit driver operable during a write cycle.

U.S. Pat. No. 3,745,539 granted July 10, 1973 to E. E. Davidson et al discloses a semiconductor device circuit for reading an FET capacitor store dynamic memory cell and for regenerating the charge (if any) in said capacitor whereby non-destructive read-out is achieved. The memory cell includes an FET switch for selectively connecting the storage capacitor to a memory array bit sense line through either one of a pair of oppositely connected bi-polar transistors for reading and writing, respectively. The bit-sense line is connected to the input terminal of a latching regenerative feedback amplifier such as a silicon controlled rectifier. The potential level at said input terminal rises to a relatively higher level by regenerative feedback action in response to a relatively lower bit sensing voltage which initiates the latching action. The storage capacitor of the memory cell is recharged via one of the bipolar transistors in response to the aforesaid relatively higher potential at the amplifier input terminal. Bipolar current switch embodiments as well as a silicon controlled rectifier embodiment are disclosed for implementing the latching regenerative feedback amplifier.

U.S. Pat. No. 3,761,899 granted Sept. 25, 1973 to V. G. McKenny et al is directed to a dynamic random access memory utilizing MOSFET transistors formed on a single semiconductor chip. The integrated circuit has internal circuits, including storage cells arranged in rows and columns, and interface circuits, including address decoders, etc. for connecting the internal circuits to control circuitry external of the integrated circuit. A primary drain voltage terminal and a primary source voltage terminal are provided for the integrated circuit and are used for the interface circuit. Circuit means formed on the chip establishes a secondary source voltage that is nearer the primary drain voltage than the primary source voltage. The secondary source voltage is used for the internal circuits and reduces loss of data due to injection from the internal circuits.

U.S. Pat. No. 3,795,859 granted Mar. 5, 1974 to J. F. Benante et al is directed to method and apparatus for determining the electrical characteristics of a memory cell having field effect transistors. The electrical characteristics of a field effect transistor of a memory cell connected to a zero bit line and of a field effect transistor of the memory cell connected to a one bit line are determined through applying a substantially constant voltage to one of the zero and one bit lines while changing the voltage condition on the other of the bit lines. Namely, in a memory cell having six FET's with two of the FET's functioning as zero and one active storage devices, two other of the FET's functioning as load devices for the two storage devices, and the final two FET's functioning as switches or controls to connect each of the storage devices to the appropriate bit lines during the read or write operations, it is necessary to determine whether the cell is capable of retaining the data indefinitely.

U.S. Pat. No. 3,795,898 granted Mar. 5, 1974 to R. J. Metha et al, is directed to a random access Read/Write Semiconductor memory for fabrication in integrated circuit form using field effect transistors. It is a dynamic memory having provision for maintaining DC stability in the four transistor memory cells so as to not require periodic refreshing. Buffer and timing circuitry is also provided for minimizing power consumption, for compatibility with TTL circuitry, and for providing read/-write access from a single clock signal.

U.S. Pat. No. 3,796,893 granted Mar. 12, 1974 to C. R. Hoffman is directed to circuits for a dynamic MOS RAM having a storage array of inverting storage cells, including an input buffer, a write circuit and a sense circuit. The input buffer circuit includes a dynamic latch circuit clocked by a first clock complement signal and is compatible with TLC logic levels. The cross coupled gate nodes of the dynamic latch are conditionally discharged by circuitry which includes a ratio type first address inverter, and a second ratio type address inverter followed by a third ratioless inverter, whose output conditionally discharges one of the cross coupled gate nodes of the dynamic latch. A separate write circuit drives each digit-sense column bus line, and includes a push-pull driver clocked by a third clock input signal. The pull-up and pull-down field effect transistors of the push-pull driver each have an exclusive OR type circuit for conditionally discharging the precharged gate electrodes of the pull-up and pull-down field effect transistors, depending on the voltages on the data input signal and the data control. The ratioless data control inverter and the data input inverter provide the complement signals required by the two exclusive OR type circuits.

U.S. Pat. No. 3,798,621 granted Mar. 19, 1974 to U. Baitinger et al is directed to a monolithic storage arrangement comprising a plurality of symmetrically disposed bistable storage cells operable as read/write and read-only elements. The storage cell is a modification of a conventional six FET bistable circuit.

SUMMARY OF THE INVENTION

The invention is directed to improvements in random access solid state memories employing FET devices and fabricated by large scale integration techniques. The circuitry of the two dimensional random access memory integrated circuit chips in accordance with the invention, may be grouped into three major circuits: storage cell array, word peripheral circuit, and bit peripheral circuit. As will be more fully apparent from the detailed description of the preferred embodiment set-forth hereinafter, the invention may more particularly be considered to be directed to bit peripheral circuitry for a random access memory integrated circuit chip based upon enhancement-depletion mode field effect transistor technology. A pair of N-channel depletion devices are used to initialize the bit lines prior to the start of the next read or write cycle. These devices are switched to a high conduction state resulting in a rapid initialization of the bit lines. A sense latch circuit incorporating enhancement and depletion mode devices is used to detect and latch a small differential signal on the bit lines. The state of the sense latch is isolated from and does not affect the bit line voltages at any time during the memory cycle. A sense latch circuit of the afore-recited type is also employed as the final latch (or latches) in the bit circuits. Each final latch is set from a selected sense latch. Each final latch output drives a data out driver.

More particularly in accordance with the invention, the bit circuitry includes a pair of N channel depletion devices associated with each pair of bit lines and a cross coupled sense circuit (sense latch) comprising six FETs (two depletion, four enhancement) also associated with each pair of bit lines. Further, one or more output latches, each comprising six FETs (two depletion, four enhancement) are appropriately coupled to said cross-coupled sense circuits. Coupled to each output latch is a data out driver.

The sense latch in accordance with this invention has the following advantages which when taken together give an improvement over prior art circuitry.

1. No coupling devices are required to connect the B/S lines to the latch.
2. No clock is required to drive B/S line coupling devices.
3. The latch is not loaded by the high capacitance of the bit lines thereby permitting fast setting of the latch.
4. A single pulse "L" is required for latch operation.
5. The depletion mode load devices of the latch automatically restore the latch nodes (SL and SR) without the use of an extra clock.
6. Power to the latch is interrupted when the latch is not in use thereby allowing lower power operation.
7. It detects on a bit line differential voltage which is a fraction of the power supply voltage. Typically 0.6 volts is sufficient.

In accordance with the invention, bit-line restore using depletion mode devices, as opposed to enhancement mode devices, results in higher speed and eliminates the error voltage due to differences in the threshold voltage between the pair of restore devices. The sense latch circuit in accordance with the invention presents high impedance to bit lines, does not charge and discharge the bit lines during setting and thus provides low power operation. The overall advantages in practicing the invention in random access solid state memory provides: higher speed of operation, lower power consumption, single power supply requirement, and single clock requirement.

In accordance with the invention, a RAM is provided which requires only a single power supply and a single clock. With the exception of the final latch (or latches), the DC power requirement is zero. Minimum power required - no inverters. Zero offset of sense signal - threshold drops eliminated. Fast DOT of memory columns. Zero clock skew delay in data output latch (i.e., no clock is required, therefore, no delay required between correct data and the arrival of a clock pulse).

A random access memory, in accordance with the invention, employing enhancement and depletion mode field effect transistors, a plurality of groups of memory cells, each memory cell of each of said groups comprising at least one field effect transistor, and being adapted to store an electrical manifestation of a binary "1"or a binary "0", a pair of bit lines corresponding to each group of memory cells, word circuit means for selectively addressing a selected memory cell in each of said groups, means for initializing each pair of bit lines, a bit peripheral circuit, for each of said groups of memory cells, connection means connecting each of said bit peripheral circuits to the bit lines of the group of memory cells with which said peripheral circuit is associated, said connection means including control means for controlling the operation of said bit peripheral circuit, each said bit peripheral circuit comprising first and second interconnected like circuit portions, each said bit peripheral circuit portions comprising at least one enhancement mode field effect transistor and at least one depletion mode field effect transistor, whereby binary words comprised of a plurality of binary bits (1's or 0's) may be randomly written into the memory and randomly read from storage.

It is a primary object of the invention to provide an improved random access memory.

It is an object of the invention to provide an improved random access memory integrated circuit chip where said random access memory employs enhancement mode and depletion mode field effect transistors, whereby small differential signals on the bit lines are accurately and reliably detected, a single power supply is required, a single clock is required, and power consumption is reduced.

It is an object of the invention to provide an improved random access memory integrated circuit chip wherein improved means is provided and employed for rapidly initializing the bit lines.

It is an object of the invention to provide an improved random access memory integrated circuit chip wherein improved means is provided and employed to detect a small differential signal on the bit lines.

It is an object of the invention to provide improved "bit" peripheral circuitry in a random access memory integrated circuit chip.

It is an object of the invention to provide an improved random access memory integrated circuit chip wherein a sense latch circuit incorporating enhancement and depletion mode devices is provided for each pair of bit lines and is used to detect and latch a small differential signal on the bit lines without loading the bit lines at any time during the memory cycle.

It is an object of the invention to provide an improved random access memory integrated circuit chip wherein the improvement essentially comprises improved bit peripheral circuits including (1) N-channel depletion mode devices to initialize the bit lines (2) a sense latch circuit incorporating enhancement and depletion mode devices is used to detect and latch a small differential signal on the lines. The state of the sense latch is isolated from and does not affect the bit line voltages at any time, and (3) improved output means consisting essentially of at least one final latch drive and data out driver means.

It is an object of the invention to provide an improved random access memory integrated circuit chip wherein improved circuit means is provided for reading data stored in said memory.

The foregoing and other objects, features and advantages of the invention will be more apparent from the following more particular description of the preferred embodiments of the invention, as illustrated in the accompanying drawings.

PREFERRED EMBODIMENT

Figure 1:
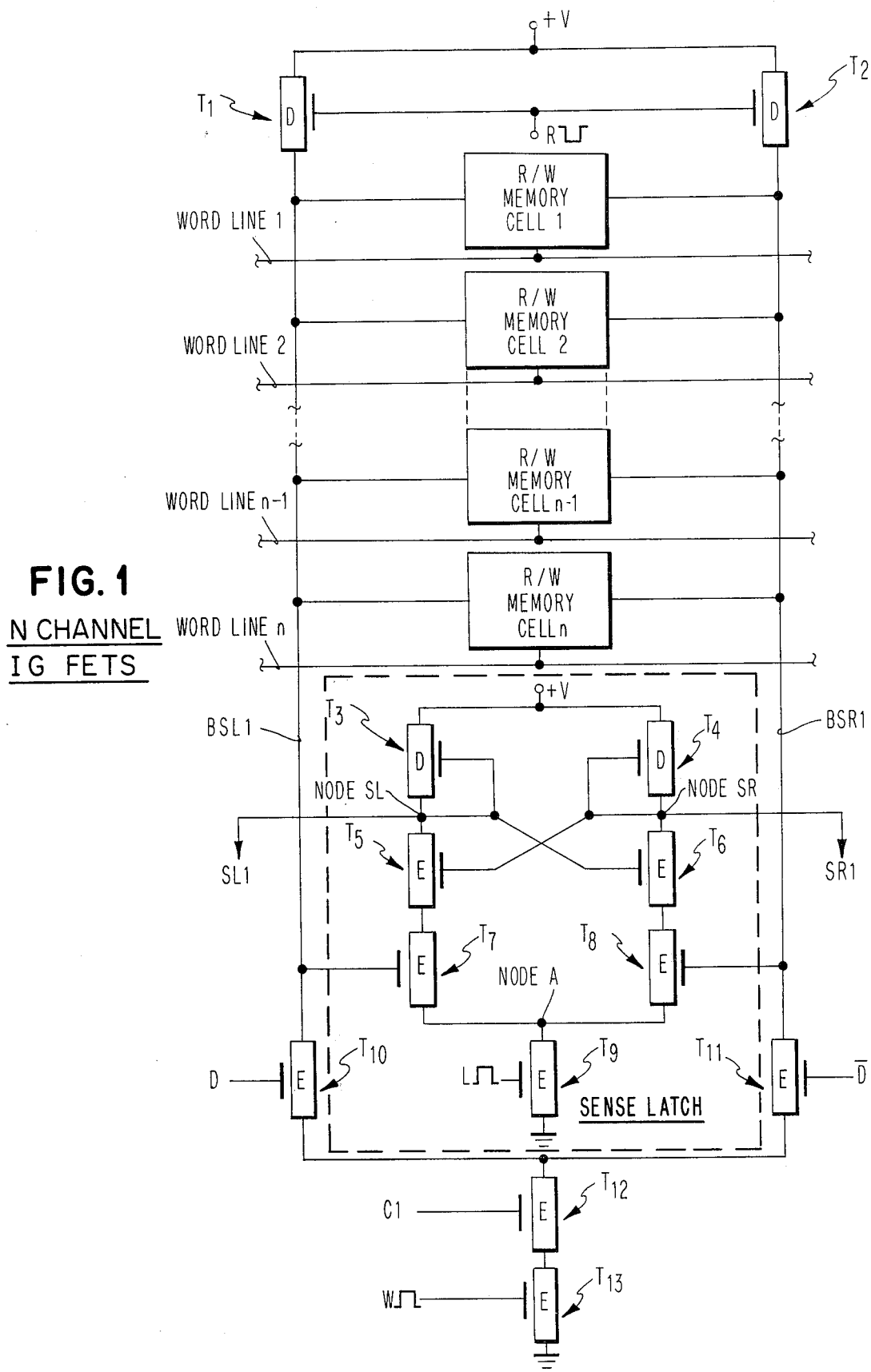
FIG. 1 depicts the circuitry of a single column of a multi-column multi-row random access memory chip in accordance with the preferred embodiment of the invention.

Reference is made to FIG. 1, wherein the circuitry of a single column of an $m$ column, $n$ row random access memory in accordance with the preferred embodiment of the invention is depicted. N-channel depletion mode field effect transistor $T_1$ has its drain connected to a positive potential +V. The positive potential +V preferably has a magnitude of 5 to 15 volts. One end of bit/sense line, BSL1, is connected to the source of $T_1$. The other end of bit/sense line BSL1 is connected to the drain of n-channel enhancement mode field effect transistor $T_{10}$. N-channel depletion mode FET $T_2$ has its drain connected to the positive potential +V. One end of bit/sense line, BSR1 is connected to the source of $T_2$. The other end of bit/sense line BSR1 is connected to the drain of n channel enhancement mode FET $T_{11}$. The source of FET $T_{10}$, and the source of FET $T_{11}$ are connected in common to the drain of $n$ channel enhancement mode FET $T_{12}$. The source of $T_{12}$ is connected to the drain of $n$ channel enhancement mode FET $T_{13}$. The source of $T_{13}$ is connected to a potential source (ground). The gates of $T_1$ and $T_2$ are connected in common and adapted to receive a signal R. The gate of $T_{10}$ is adapted to receive a signal D. The gate of $T_{11}$ is adapted to receive a signal $\overline{D}$. The signals D and $\overline{D}$, hereinafter referred to as the data signals, are logical complements. The gate of $T_{12}$ is adapted to receive a signal $C_1$. The gate of $T_{13}$ is adapted to receive a signal W.

Figure 5A:
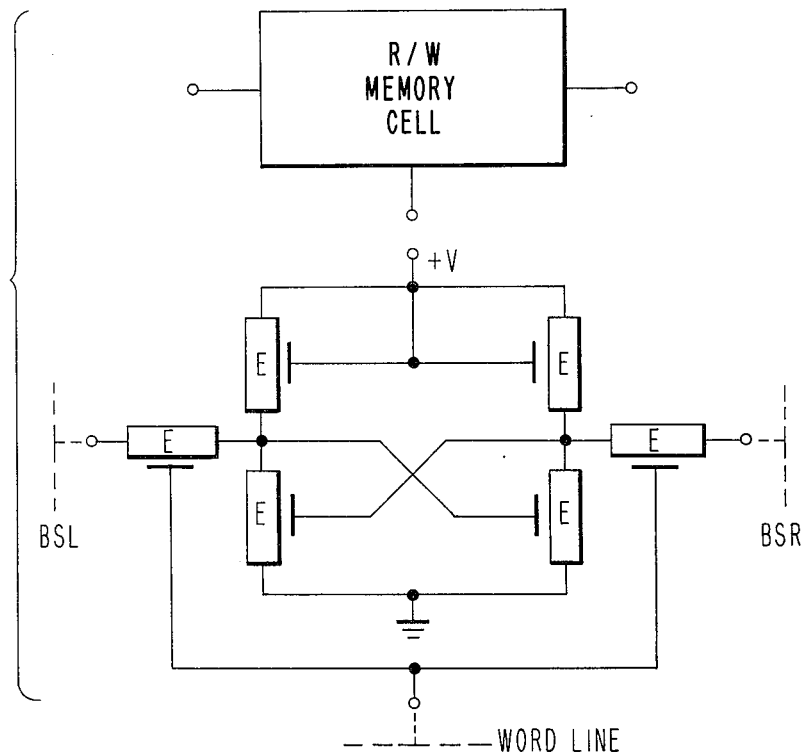
FIG. 5A depicts the circuitry of a first typical, or representative, memory cell, known to the art, which may be utilized as the memory cell in the multi-column, multi-row random access memory chip in accordance with the preferred embodiment of the invention.
Figure 5B:
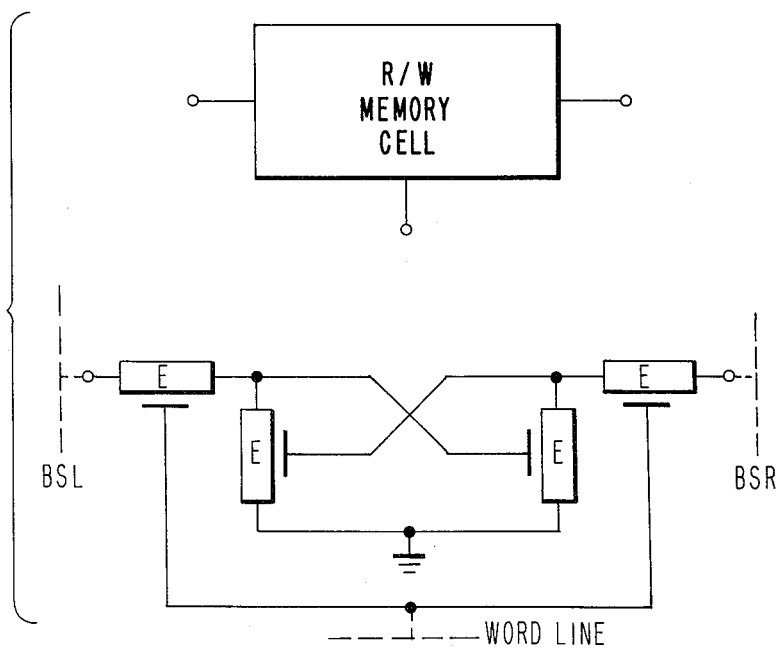
FIG. 5B depicts the circuitry of a second typical, or representative, memory cell, known to the art which may be utilized as the memory cell in the multi-column, multi-row random access memory chip in accordance with the preferred embodiment of the invention.

As depicted in FIG. 1, $n$ memory cells are respectively connected between bit/sense line BSL1 and bit/sense line BSR1. Associated with, and connected to each memory cell is a discrete word line. The number of memory cells, $n$, connected across a single pair of bit lines, may vary largely as a matter of circuit design, fabrication process limitation, and chip topology. In the preferred embodiment $n=32$, still referring to FIG. 1, it will be seen that only 4 of the 32 memory cells (where $n=32$) are expressly shown for convenience of explanation. Namely, memory cells, 1, 2, - - - $n-1$ and $n$, together with their respective word lines 1, 2, - - - $n-1$ and $n$ are depicted in FIG. 1. Each of the $n$ memory cells may be of the type depicted in FIG. 5A. The memory cell shown in FIG. 5A is well known to the art, and commonly referred to in the art as a "six device" cell. The memory cell of FIG. 5A is disclosed in the aforeidentified U.S. Pat. Nos. 3,795,859 and 3,798,621. Alternatively, each of the n memory cells may be of the type depicted in FIG. 5B. The memory cell shown in FIG. 5B is well known to the art, and commonly referred to in the art as a "four device" cell. The memory cell of FIG. 5B is disclosed in the afore-identified U.S. Pat. No. 3,685,027. Numerous memory cells consisting essentially of field effect devices are known to the art. From the detailed description of applicants' invention hereinafter, it will be fully apparent to persons skilled in the art that at least certain of these cells may be readily employed in the practice of applicants' invention.

Referring to FIG. 1, it will be seen that a sense latch comprising interconnected FETs $T_3$, $T_4$, $T_5$, $T_6$, $T_7$, $T_8$ and $T_9$ is connected between bit/sense line BSL1 and bit/sense line BSR1. Transistors $T_3$ and $T_4$ are respectively of $n$ channel depletion mode type. Transistors $T_5$, $T_6$, $T_7$, $T_8$ and $T_9$ are respectively of $n$ channel enhancement type. As shown in FIG. 1: the drain of $T_3$ is connected to the positive potential $+V$; the source of $T_3$ is commonly connected to the drain of $T_5$, the gate of $T_3$, the gate of $T_6$, and the first of two latch outputs, namely SL1; the source of $T_5$ is connected to the drain of $T_7$; the source of $T_7$ is connected to the drain of $T_9$; the source of $T_9$ is connected to the reference potential (ground); the drain of $T_4$ is connected to the positive potential $+V$; the source of $T_4$ is commonly connected to the drain of $T_6$, the gate of $T_4$, the gate of $T_5$, and the second of two latch outputs, namely SR1; the source of $T_6$ is connected to the drain of $T_8$; the source of $T_8$ is connected to the drain of $T_9$; the gate of $T_7$ is connected to the bit/sense line BSL1; and the gate of $T_8$ is connected to the bit/sense line BSR1. The gate of $T_9$ is adapted to receive a signal L. Further, the first sense latch output SL1 is taken from node SL, and the second sense latch output is taken from node SR.

Figure 3:
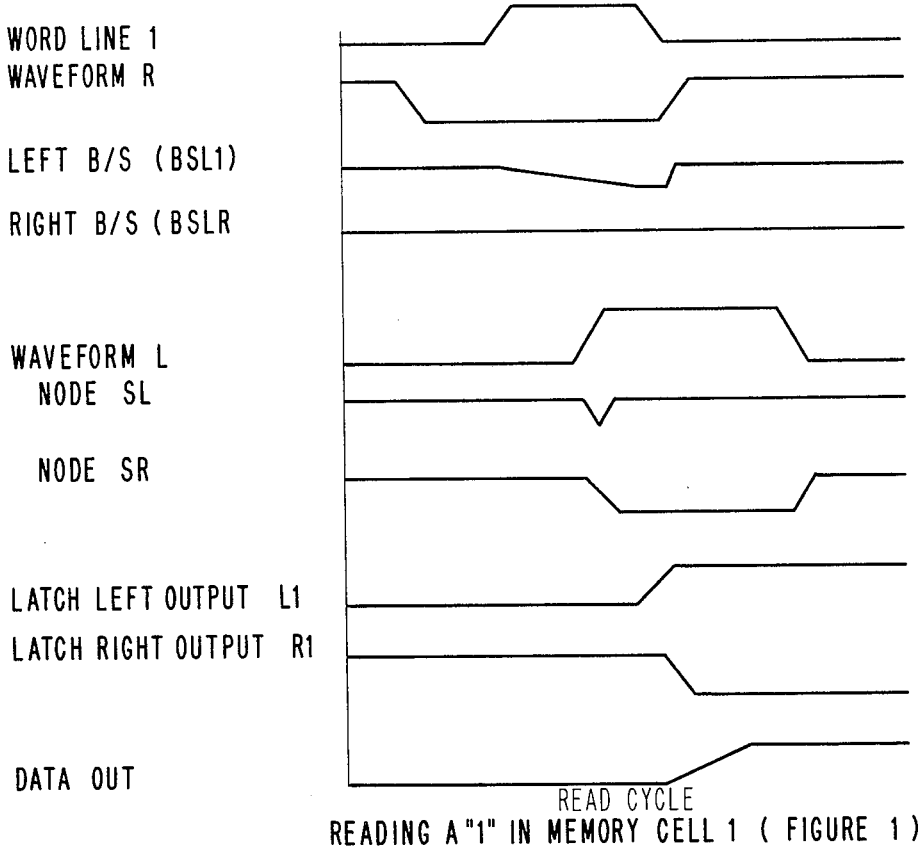
FIG. 3 depicts idealized waveforms utilized in explaining the "read cycle" of the multi-column, multi-row random access memory chip in accordance with the preferred embodiment of the invention.
Figure 4:
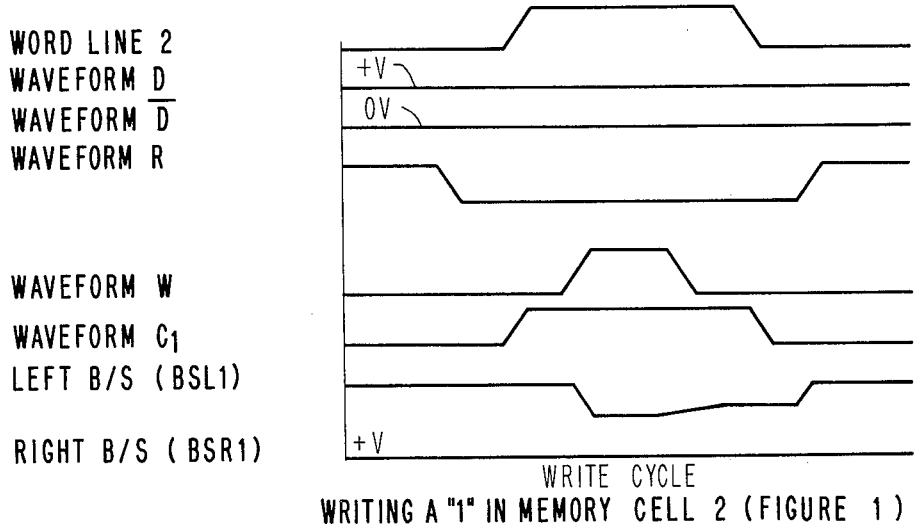
FIG. 4 depicts idealized waveforms utilized in explaining the "write cycle" of the multi-column, multi-row random access memory chip in accordance with the preferred embodiment of the invention.

The operation of the memory in accordance with the invention and with reference to FIGS. 1, 3 and 4 will now be described. FIGS. 3 and 4 disclose the timing and waveforms for "Read" and "write" operations, respectively. In FIG. 3, the waveforms shown, although generally applicable to the memory, will be referred to in explaining the "reading" of a binary "1" from memory cell 1 of FIG. 1. In FIG. 4, the waveforms shown, although generally applicable to the memory will be referred in explaining the "writing" of binary "1" in memory cell 2 of FIG. 1.

The "R" pulse is impressed on the gates of depletion mode devices $T_1$ and $T_2$. The "R" pulse is normally high and thus $T_1$ and $T_2$ are normally "on". Thus, the bit/sense lines, BSL1 and BSR1 are normally charged to $+V$. Now, for a "read" or "write" operation, the "R" pulse drops to zero volts. This causes devices $T_1$ and $T_2$ to stop conducting since the gates are more negative with respect to the sources than the threshold voltage of the devices. This remains true until the bit/sense lines drop (BSL1 and BSR1) to approximately 2 volts (assuming $-2$ volt thresholds for the depletion mode devices). For a "read" operation, waveform W remains low and thus, $T_{13}$ remains "off", devices $T_{10}$ through $T_{13}$ may be ignored. The sequence of operation for a read cycle is described as follows. First the "R" pulse drops to zero and either coincidentally or after some delay, one cell along each bit line pair is enabled by the word line. In this illustrative example, referring to FIG. 1, the memory cell is "memory cell 1" connected between bit/sense lines BSL1 and BSR1 and the word line is "word line 1". This causes one bit line to begin to discharge toward zero volts. In this illustrative example, it is the left bit/sense line, BSL1, as shown in FIG. 3, whose potential decreases towards zero volts. This reduces the gate-to-source voltage of $T_7$ but leaves the gate-to-source voltage for $T_8$ unchanged. Waveform L, or pulse L, remains low during this time (see FIG. 3) and thus, there is no current flowing in $T_7$ or $T_8$ at this time. Devices $T_5$ and $T_6$ also have no current flowing in them, but each have $+V$ impressed on their gate through devices $T_4$ and $T_3$, respectively.

Now still referring to FIGS. 1 and 3, the sense latch is set by bringing up the potential on the gate of device $T_9$. This is accomplished by the "L" pulse of waveform L. This causes a drop in node A (FIG. 1) voltage which turns "on" devices $T_8$ and $T_6$. Device $T_7$ tends to remain "off", or at least be less conductive, due to its smaller gate-to-source voltage compared to $T_8$. This causes node SR to discharge faster than node SL. The regenerative nature of the latch causes SR to continue to drop to approximately zero volts while node SL returns to $+V$. Thus, as depicted in FIG. 3, only a small "glitch" in potential occurs at node SL.

A differential voltage of approximately 0.6 volt is sufficient to set the sense latch considering typical device operation. The sense latch is effectively isolated from the bit/sense lines and, therefore, the bit/sense lines can be prepared for the next read cycle without disturbing the latch data.

Devices $T_{10}$ through $T_{13}$ are utilized to write data into one of the cells on a selected bit line pair. The memory cell to be written into is determined by the row and column inputs. The data to be written is pesented in true and complementary form to the gates of devices $T_{10}$ and $T_{11}$. See waveforms D and $\overline{D}$, where $\overline{D}$ is the complement of D in FIG. 4. $T_{12}$ is on only for the selected column as determined by the address inputs. In the illustrative example of the operation of the structure of FIG. 1 reference is made to Waveform $C_1$, FIG. 4. When the waveform W goes positive (W pulse), the selected cell on the selected column of the memory will be written according to the data presented on data lines (waveforms) D and $\overline{D}$. Referring to FIG. 4, the waveforms are depicted for writing a logical "1" into memory cell 2 of FIG. 1.

Figure 2:
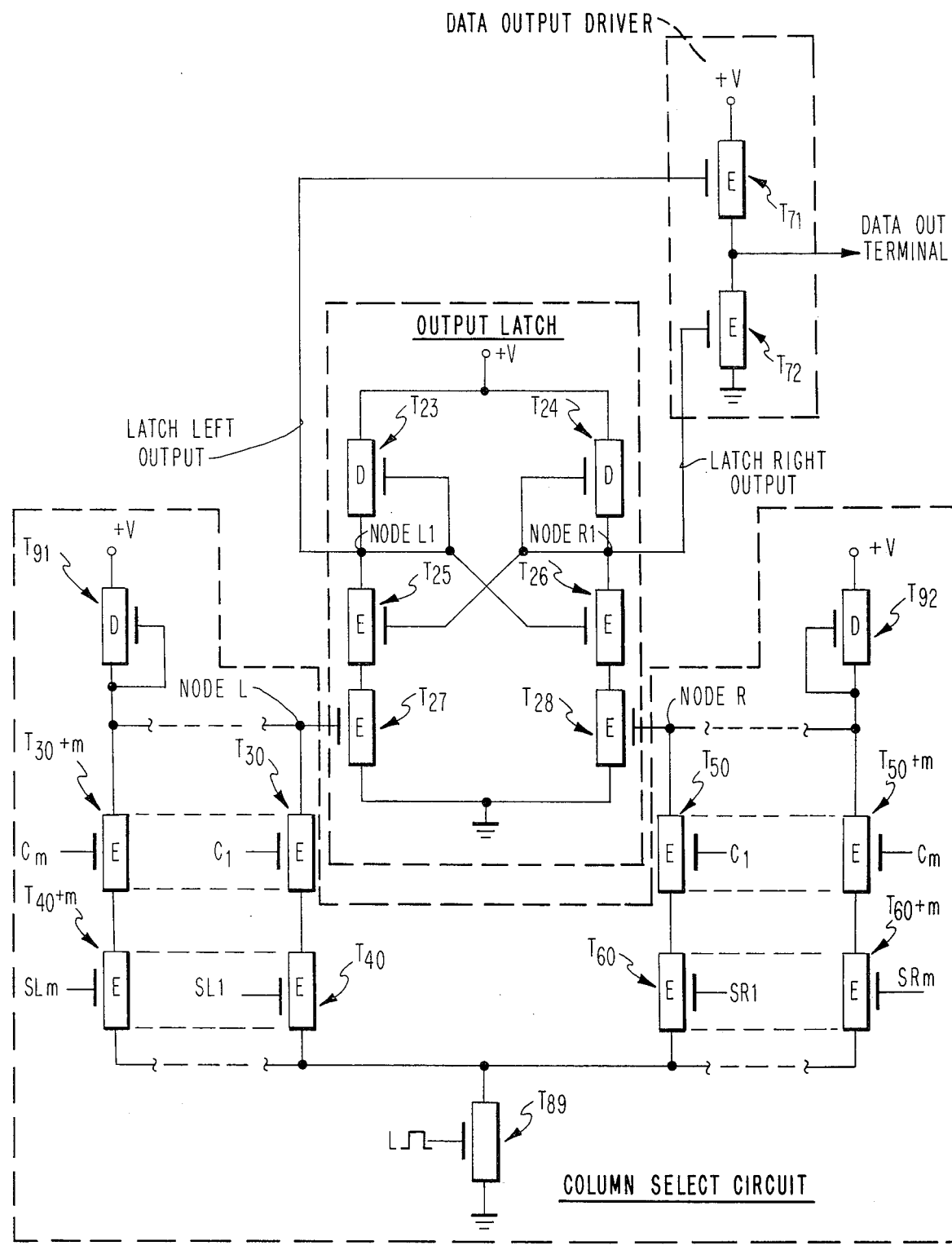
FIG. 2 depicts the circuitry of a final latch and output data driver of a multi-column, multi-row random access memory chip in accordance with the preferred embodiment of the invention.

FIG. 2 discloses the data output driver, the output latch and the column select circuit. For convenience of explanation, the data output driver, the output latch and the column select circuit are respectively designated by correspondingly labelled enclosed broken lines.

The data output driver is essentially comprised of enhancement mode field effect transistors $T_{71}$ and $T_{72}$. The drain of $T_{71}$ is connected to the positive potential $+V$. The source of $T_{71}$ is connected to the drain of $T_{72}$. The source of $T_{72}$ is connected to the reference potential (ground). The gate of $T_{71}$ is connected to the left output (node L1) of the output latch. The gate of $T_{72}$ is connected to the right output (node R1) of the output latch. As shown in FIG. 3 the Data Out Terminal is commonly connected to the source of $T_{71}$ and the drain of $T_{72}$.

The output latch is essentially comprised of depletion mode field effect transistors $T_{23}$ and $T_{24}$ and enhancement mode field effect transistors $T_{25}$, $T_{26}$, $T_{27}$ and $T_{28}$. The drain of $T_{23}$ is connected to the positive potential +V. The source of $T_{23}$ is connected in common (node L1) to the gate of $T_{23}$, the gate of $T_{26}$, the drain of $T_{25}$ and the gate of $T_{71}$ of the data output driver. The source of $T_{25}$ is connected to the drain of $T_{27}$. The source of $T_{27}$ is connected to the reference potential (ground). The drain of $T_{24}$ is connected to the positive potential +V. The source of $T_{24}$ is connected in common (node R1) to the gate of $T_{24}$, the gate of $T_{25}$, the drain of $T_{26}$, and the gate of $T_{72}$ of the data output driver. The source of $T_{26}$ is connected to the drain of $T_{28}$. The source of $T_{28}$ is connected to reference potential (ground). The gate of $T_{27}$ is connected to node L of the column select circuit. The gate of $T_{28}$ is connected to node R of the column select circuit.

The column select circuit is essentially comprised of depletion mode field effect transistors $T_{91}$ and $T_{92}$, and enhancement mode field effect transistors $T_{30}$ through $T_{30+m}$, $T_{40}$ through $T_{40+m}$, $T_{50}$ through $T_{50+m}$, $T_{60}$ through $T_{60+m}$ and $T_{89}$. The drain of $T_{91}$ is connected to the positive potential +V. The source of $T_{91}$ is connected to node L. The gate of $T_{91}$ is connected to the source of $T_{91}$. The drain of $T_{92}$ is connected to the positive potential +V. The source of $T_{92}$ is connected to node R. The gate of $T_{92}$ is connected to the source of $T_{92}$.

The drain of each of the field effect transistors $T_{30}$ through $T_{30+m}$ is connected to node L. The sources of $T_{30}$ through $T_{30+m}$ are respectively connected to the drains of $T_{40}$ through $T_{40+m}$. The sources of $T_{40}$ through $T_{40+m}$ are each connected to the drain of $T_{89}$. The source of $T_{89}$ is connected to the reference potential (ground). The drain of each of the field effect transistors $T_{50}$ through $T_{50+m}$ is connected to node R. The sources of $T_{50}$ through $T_{50+m}$ are respectively connected to the drains of $T_{60}$ through $T_{60+m}$. The sources of $T_{60}$ through $T_{60+m}$ are each connected to the drain of $T_{89}$.

Still referring to FIG. 2, it should be appreciated that field effect transistors $T_{30}$, $T_{40}$, $T_{50}$ and $T_{60}$ are utilized in selecting column 1 of an $m$ column memory; field effect transistors $T_{31}$, $T_{41}$, $T_{51}$ and $T_{61}$ (not expressly shown in the drawing) are utilized in selecting column 2 of an $m$ column memory; - - - ; field effect transistors $T_{30+m-1}$, $T_{40+m-1}$, $T_{50+m-1}$ and $T_{60+m-1}$ (not expressly shown in the drawing) are utilized in selecting column $m-1$ of an $m$ column memory; and field effect transistors $T_{30+m}$, $T_{50+m}$ and $T_{60+m}$ are utilized in selecting column $m$ of an $m$ column memory.

Figure 6:
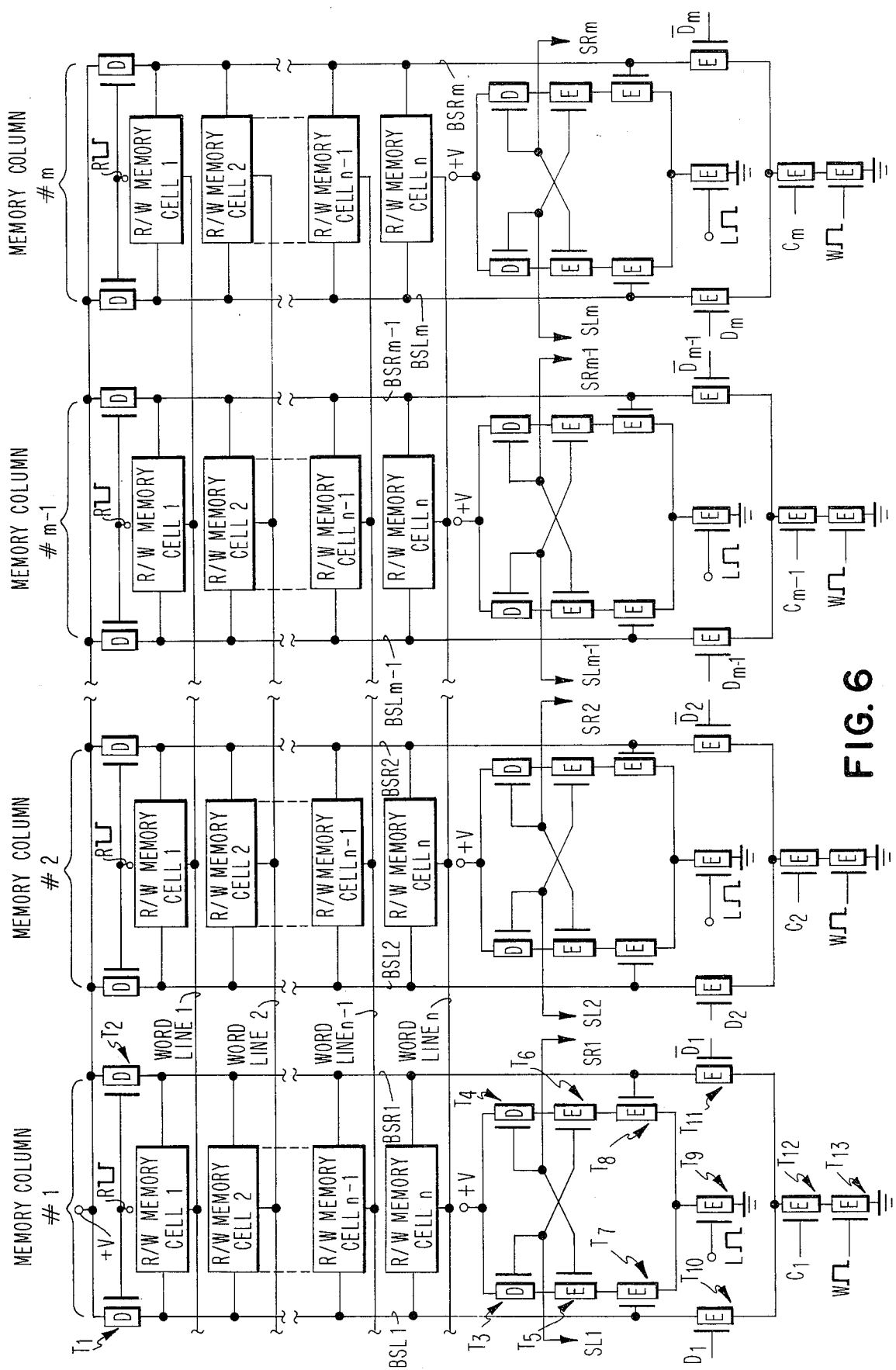
FIG. 6 depicts the circuitry of a plurality of columns of a multi-column, multi-row random access memory chip in accordance with the preferred embodiment of the invention.

Referring to FIGS. 1, 2 and 6, it is to be appreciated that the sense latch outputs SL1 through SLm (namely, the left side of each sense latch of the $m$ column memory) are respectively connected to the gates of field effect transistors $T_{40}$ through $T_{40+m}$. Correspondingly, the sense latch outputs SR1 and SRm (namely, the right side of each sense latch of the $m$ column memory) are respectively connected to the gates of field effect transistors $T_{60}$ through $T_{60+m}$. Field effect transistors $T_{30}$ through $T_{30+m}$ are respectively selected by column select waveforms (pulses) $C_1$ through $C_m$. Correspondingly, field effect transistors $T_{50}$ through $T_{50+m}$ are respectively selected by column select waveforms (pulses) $C_1$ through $C_m$. Waveforms $C_1$ through $C_m$ are respectively provided by column select circuitry (not shown) as was waveform $C_1$ in FIG. 1. One, and only one of the lines conveying waveforms $C_1$ through $C_m$ will be up during a read cycle.

The operation of the circuitry of FIG. 2 will now be explained with reference to FIG. 1, namely, the selection of column 1 of an $m$ column memory. Thus during the read cycle, waveform $C_1$ will be up. This will condition or turn "on" during the read cycle either, $T_{30}$ and $T_{40}$, or $T_{50}$ and $T_{60}$. Namely, the gates of transistors $T_{30}$ and $T_{50}$ will respectively be conditioned, whereas only the gate of $T_{40}$ or the gate of $T_{60}$ will be conditioned. Assume for purposes of explanation that the state of the sense latch of column one of the memory is such that $T_{30}$ and $T_{40}$ have their gates conditioned. Now as waveform L impressed on the gate of $T_{89}$ goes "up", $T_{89}$ is turned "on" as are $T_{30}$ and $T_{40}$. Thus, node L proceeds to discharge from its +V value to something close to zero volts. This turns off $T_{27}$ and results in the output latch having its "latch left output" (node L1) go high and its "latch right output" (node R1) go low. When the waveform (pulse) L returns to zero volts, node L returns to +V and the data written into the final latch remains valid.

$T_{71}$ and $T_{72}$ are the off-chip driver transistors. The gate of $T_{71}$ is driven by the latch left output (node L1) of the output latch. The gate of $T_{72}$ is driven by the latch right output (node R1) of the output latch. $T_{71}$ functions in the source follower mode. As the latch left output (node L1) rises, the chip data output rises. (Data Output Terminal, FIG. 2). As the latch right output (node R1) rises, the chip data output falls. Namely, $T_{72}$ is turned "on" when node R1 rises and turned "off" when node R1 falls.

From the preceding description and explanation of the preferred embodiment of applicants' invention, it will be apparent that a plurality of output latches may be associated with an $m$ column memory, whereby a binary word having up to $m$ binary bits of information may be simultaneously read from the memory. Correspondingly, a binary word having up to $m$ binary bits of information may be simultaneously written into the memory. Thus, applicants' invention is not to be construed as limited to the preferred embodiments. Numerous modifications may be made, as will be apparent to persons skilled in the art without departing from the spirit or scope of the invention.

While the invention has been described and shown particularly with reference to one of its preferred embodiments, it will be understood by those skilled in the art to which the work is directed that various changes in form and in detail may be made without departing from either the spirit or scope of the invention.

What is claimed is:

1. In a random access memory employing enhancement and depletion mode field effect transistors:
    a plurality of groups of memory cells, each memory cell of each of said groups comprising at least one field effect transistor, and being adapted to store an electrical manifestation of a binary "1" or a binary "0";
    a pair of bit lines corresponding to each group of memory cells;

word circuit means for selectively addressing a selected memory cell in each of said groups;

means for initializing each pair of bit lines;

a bit peripheral circuit for each of said groups of memory cells;

connection means, connecting each of said bit peripheral circuits to the bit lines of the group of memory cells with which said peripheral circuit is associated;

said connection means including control means for controlling the operation of said bit peripheral circuit;

each said bit peripheral circuit comprising first and second interconnected like circuit portions;

each said bit peripheral circuit portions comprising at least one enhancement mode field effect transistor and at least one depletion mode field effect transistor, whereby binary words comprised of a plurality of binary bits (1's or 0's) may be randomly written into and randomly read from said memory.

2. In a random access memory employing enhancement and depletion mode field effect transistors, as recited in claim 1, wherein said memory cells are respectively comprised of $n$ channel enhancement mode field effect transistors, and said means for initializing each pair of bit lines comprises an $n$ channel depletion mode field effect transistor for each of said bit lines, each said $n$ channel depletion mode field effect transistor serially connecting the bit line with which it is associated to a first positive potential $V_1$.

3. In a random access memory employing enhancement and depletion mode field effect transistors, as recited in claim 2, wherein said bit peripheral circuit for each of said groups of memory cells includes a sense latch, said sense latch comprising:

first and second depletion mode field effect transistors, each having a drain, source and gate electrode;

first, second, third, fourth and fifth enhancement mode field effect transistors, each having a drain, source and gate electrode;

first connection means, connecting the drain of said first depletion mode field effect transistor and the drain of said second depletion mode field effect transistor to said first positive potential $V_1$;

second connection means, connecting in common the source of said first depletion mode field effect transistor, the drain of said first enhancement mode field effect transistor, the gate electrode of said first depletion mode field effect transistor, and said gate electrode of said second enhancement mode field effect transistor;

third connection means, connecting in common the source of said second depletion mode field effect transistor, the drain of said second enhancement mode field effect transistor, the gate electrode of said second depletion mode field effect transistor, and the gate electrode of said first enhancement mode field effect transistor;

fourth connection means, connecting the source of said first enhancement mode field effect transistor to the drain of said third enhancement mode field effect transistor;

fifth connection means, connecting the source of said second enhancement mode field effect transistor to said drain of said fourth enhancement mode field effect transistor;

sixth connection means, connecting in common the source of said third enhancement mode field effect transistor, the source of said fourth enhancement mode field effect transistor, and the drain of said fifth enhancement mode field effect transistor;

seventh connection, connecting the source of said fifth enhancement mode field effect transistor a second potential $V_2$, where $V_2$ has a magnitude less than $V_1$;

wherein said connections means, as recited in claim 2, connects the gate electrode of said third enhancement mode field effect transistor to a first one of said pair of bit lines, and the gate electrode of said fourth enhancement mode field effect transistor to the second one of said pair of bit lines;

and wherein said control means, as recited in claim 2, is connected to the gate electrode of said fifth enhancement mode field effect transistor.

4. In a random access memory integrated circuit chip employing enhancement and depletion mode field effect transistors, each of said enhancement and depletion mode field effect transistors having a source, drain and gate electrode, said random access memory including an array of "N" rows and "M" columns of storage cells, where "N" and "M" are integers, each of said M columns comprising:

a first bit/sense line initializing depletion mode field effect transistor having its drain connected to a source of positive potential $V_1$;

a second bit/sense line initializing depletion mode field effect transistor having its drain connected to said source of positive potential $V_1$;

a first data input enhancement mode field effect transistor;

a second data input enhancement mode field effect transistor;

a first bit/sense line connecting the source of said first bit/sense line initializing depletion mode field effect transistor to the drain of said first data input enhancement mode field effect transistor;

a second bit/sense line connecting the source of said second bit/sense line initializing depletion mode field effect transistor to the drain of said second data input enhancement mode field effect transistor;

a column select enhancement mode field effect transistor having its drain connected to the source of said first data input enhancement mode field effect transistor and to the source of said second data input enhancement mode field effect transistor;

a write control enhancement mode field effect transistor having its drain connected to the source of said column select enhancement mode field effect transistor and its source connected to a second source of potential $V_2$, where the magnitude of $V_2$ is less positive than the magnitude of $V_1$;

$n$ memory cells, each of said $n$ memory cells being connected to said first bit/sense line and to said second bit/second line;

$n$ word lines, each of said word lines being connected to a discrete one of said $n$ memory cells;

and a sense latch including enhancement mode and depletion mode field effect transistors, said sense latch being connected to said first and said second bit/sense lines and to said first and said second potential sources, $V_1$ and $V_2$, said sense latch having first and second output terminals for providing a complementary output electrically manifesting data stored in said sense latch;

means for applying potentials to the gate electrodes of said first and said second bit/sense line initializing depletion mode field effect transistors, said gate electrode of said column select enhancement mode field effect transistor, said gate electrode of said write control enhancement mode field effect transistor, said $n$ words lines, said gate electrode of said first data input enhancement mode field effect transistor and said gate electrode of said second data input enhancement mode field effect transistor, whereby a binary one, or a binary zero may be selectively written into or read from any one of said $n$ memory cells.

5. In a random access memory integrated circuit chip employing enhancement and depletion mode field effect transistors, as recited in claim 4, wherein additional means is provided, whereby a binary word having M or less binary bits (1's or 0's) may be written into or read from predetermined memory cells in said array of "N" × "M" memory cells.

6. A bistable latch circuit having first and second stable states of conductivity, said latch circuit comprising:

first and second depletion mode field effect transistors each having a drain, source and gate electrode;

third, fourth, fifth and sixth enhancement mode field effect transistors each having a drain, source and gate electrode;

first means for impressing a first potential $V_1$ on said drain of said first field effect transistor, and said drain of said second field effect transistor;

second means for impressing a second potential $V_2$ on said source of said fifth field effect transistor, and said source of said sixth field effect transistor;

means directly connecting the source of said third field effect transistor to the drain of said fifth field effect transistor;

means directly connecting the source of said fourth field effect transistor to the drain of said sixth field effect transistor;

first connection means, connecting in common the gate of said first field effect transistor, the source of said first field effect transistor, the gate of said fourth field effect transistor, and the drain of said third field effect transistor;

second connection means, connecting in common the gate of said second field effect transistor, the source of said second field effect transistor, the gate of said third field effect transistor, and the drain of said fourth field effect transistor;

output circuit means connected to said first connection means and to said second connection means, said output circuit means providing a first electrical manifestation when said latch circuit is in said first stable state of conductivity and a second electrical manifestation when said latch circuit is in said second stable state of conductivity;

input circuit means connected to the gate of said fifth field effect transistor and to the gate of said sixth field effect transistor, said input circuit means impressing complementary first electrical potentials, or complementary second electrical potentials, on said gates of said fifth and sixth field effect transistors, whereby said latch circuit assumes said first stable state of conductivity in response to said complementary first electrical potentials and said second stable state of conductivity in response to said complementary second electrical potentials, respectively, being impressed on said gates of said fifth and sixth field effect transistors.

7. A bistable latch circuit having first and second stable states of conductivity, as recited in claim 6, wherein said output circuit means comprises:

seventh and eigth enhancement mode field effect transistors, each of states seventh and eighth field effect transistors having a drain, source and gate electrode;

means connecting the drain of said seventh field effect transistor to said first potential $V_1$;

means connecting the source of said eighth field effect transistor to said second potential $V_2$;

means connecting the gate of said seventh field effect transistor to said first connection means;

means connecting the gate of said eighth field effect transistor to said second connection means;

and data output means interconnecting the source of said seventh field effect transistor and the drain of said eighth field effect transistor, said data output means exhibiting a first electrical representation when said latch circuit is in said first stable state of conductivity, and a second electrical representation when said latch circuit is in said second stable state of conductivity.

8. A bistable latch circuit having first and second stable states of conductivity, as recited in claim 7, wherein said input circuit means comprises:

ninth and tenth depletion mode field effect transistors, each having a drain, source and gate electrode;

an eleventh enhancement mode field effect transistor having a drain, source and gate electrode;

means connecting the drain of said ninth field effect transistor to said first potential $V_1$;

means connecting the drain of said tenth field effect transistor to said first potential $V_1$;

means connecting the source of said eleventh field effect transistor to said second potential $V_2$;

third connection means connecting in common the source of said ninth field effect transistor, the gate of said ninth field effect transistor, and the gate of said fifth field effect transistor;

fourth connection means connecting in common the source of said tenth field effect transistor, the gate of said tenth field effect transistor, and the gate of said sixth field effect transistor;

a first group of discrete switch means, each of said first group of switch means being respectively connected between said third connection means and the drain of said eleventh field effect transistor;

a second group of discrete switch means each of said second group of switch means being respectively connected between said fourth connection means and the drain of said eleventh field effect transistor; and means connected to the gate of said eleventh transistor for selectively causing said eleventh transistor to assume a conductive state or a non-conductive state, whereby said input circuit means is conditioned or deconditioned in accordance with the conductive, or non-conductive state of said eleventh field effect transistor.

9. A bistable latch circuit having first and second stable states of conductivity, as recited in claim 8, wherein each of said discrete switch means of said first group of discrete switch means, and each of said discrete switch means of said second group of discrete switch means are identical, one to another, and each of said discrete switch means of said first and said second groups is comprised of one or more enhancement mode field effect transistors.

10. In a random access memory integrated circuit chip employing enhancement and depletion mode field effect transistors, each of said enhancement and depletion mode field effect transistors having a source, drain and gate electrode, said random access memory including:
 - an array of "N" rows and "M" columns of storage cells, where "N" and "M" are integers;
 - said memory including "M" sense latches, each of said "M" sense latches being coupled circuit the "N" memory cells of a discrete one of said "M" columns;
 - a bistable latch circuit, as recited in claim 9, and having first and second stable states of conductivity;
 - circuit means connecting each of said "M" sense latches to a discrete one of said first group of discrete switch means and to a discrete one of said second group of switch means, whereby said first and said second electrical representations are employed to represent the binary data stored in any selected one of said $m \times n$ memory cells of said random access memory.

11. In a random access memory employing enhancement and depletion mode field effect transistors, as recited in claim 10, wherein each of said M sense latches comprises:
 - first and second depletion mode field effect transistors, each having a drain, source and gate electrode;
 - first, second, third, fourth and fifth enhancement mode field effect transistors, each having a drain, source and gate electrode;
 - first connection means, connecting the drain of said first depletion mode field effect transistor and the drain of said second depletion mode field effect transistor to said first positive potential $V_1$;
 - second connection means connecting in common the source of said first depletion mode field effect transistor, the drain of said first enhancement mode field effect transistor, the gate electrode of said first depletion mode field effect transistor and said gate electrode of said second enhancement mode field effect transistor;
 - third connection means, connecting in common the source of said second depletion mode field effect transistor, the drain of said second enhancement mode field effect transistor, the gate electrode of said second depletion mode field effect transistor, and the gate electrode of said first enhancement mode field effect transistors;
 - fourth connection means, connecting the source of said first enhancement mode field effect transistor to the drain of said third enhancement mode field effect transistor;
 - fifth connection means, connecting the source of said second enhancement mode field effect transistor to said drain of said fourth enhancement mode field effect transistor;
 - sixth connection means, connecting in common the source of said third enhancement mode field effect transistor, the source of said fourth enhancement mode field effect transistor and the drain of said fifth enhancement mode field effect transistor; and
 - seventh connection means connecting the source of said fifth enhancement mode field effect transistor to said second potential $V_2$.

12. In a random access memory employing enhancement and depletion mode field effect transistors, as recited in claim 1,
 - wherein said memory cells are respectively comprised of $p$ channel enhancement mode field effect transistors, and
 - said means for initializing each pair of bit lines comprises a $p$ channel depletion mode field effect transistor for each of said bit lines,
 - each said $p$ channel depletion mode field effect transistor serially connecting the bit line with which it is associated to a first negative potential $V_1$.

* * * * *

UNITED STATES PATENT OFFICE
CERTIFICATE OF CORRECTION

PATENT NO. : 3,953,839
DATED : April 27, 1976
INVENTOR(S) : Richard T. Dennison and D. B. Eardley It is certified that error appears in the above-identified patent and that said Letters Patent are hereby corrected as shown below:

| | |
|---|---|
| Column 3, line 27 | "TLC" should read -- TTL --. |
| Column 8, line 5 | after "off" delete comma (,) and insert -- a period (.) --. |
| Column 8, line 5 | before "devices" insert -- With $T_{13}$ "off", --. |
| Column 9, line 57 | after "$T_{30+m}$" insert -- -- $T_{40+m}$ --. |
| Column 14, line 10 | "eigth" should read -- eighth --. |
| Column 14, line 11 | "states" should read -- said --. |
| Column 15, line 19 | delete "circuit" and insert -- to --. |

Signed and Sealed this

Thirteenth Day of July 1976

[SEAL]

Attest:

RUTH C. MASON
Attesting Officer

C. MARSHALL DANN
Commissioner of Patents and Trademarks